(12) United States Patent
Kusano et al.

(10) Patent No.: US 9,125,321 B2
(45) Date of Patent: Sep. 1, 2015

(54) PACKAGE

(75) Inventors: Yoshiyuki Kusano, Chiyoda-ku (JP); Mutsumi Shimazaki, Chiyodu-ku (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 114 days.

(21) Appl. No.: 13/882,217

(22) PCT Filed: Nov. 9, 2010

(86) PCT No.: PCT/JP2010/069925
§ 371 (c)(1),
(2), (4) Date: Apr. 29, 2013

(87) PCT Pub. No.: WO2012/063321
PCT Pub. Date: May 18, 2012

(65) Prior Publication Data
US 2013/0215585 A1   Aug. 22, 2013

(51) Int. Cl.
*H05K 1/11* (2006.01)
*H05K 1/18* (2006.01)
(Continued)

(52) U.S. Cl.
CPC .............. *H05K 1/185* (2013.01); *B81B 7/007* (2013.01); *H01L 23/3107* (2013.01); *H01L 23/3121* (2013.01); *H01L 23/495* (2013.01); *H01L 23/49575* (2013.01); *B81B 2207/095* (2013.01); *H01L 24/48* (2013.01); *H01L 2224/48245* (2013.01); *H01L 2224/48247* (2013.01); *H01L 2924/1461* (2013.01); *H01R 13/113* (2013.01);

(Continued)

(58) Field of Classification Search
CPC .............. B81B 2207/095; B81B 7/007; H01L 2224/48245; H01L 2224/48247
USPC .......... 361/760, 761, 785, 791; 174/260, 255, 174/256, 258, 262
See application file for complete search history.

(56) References Cited

U.S. PATENT DOCUMENTS

| 6,396,711 | B1 * | 5/2002 | Degani et al. ................. 361/760 |
| 2014/0202838 | A1 * | 7/2014 | Sano et al. ..................... 200/181 |
| 2014/0233086 | A1 * | 8/2014 | Oberst et al. .................. 359/291 |

FOREIGN PATENT DOCUMENTS

| JP | 4-127996 U | 11/1992 |
| JP | 6-13480 A | 1/1994 |

(Continued)

OTHER PUBLICATIONS

Office Action (Notice of Rejection) dated Aug. 27, 2013, issued by the Japanese Patent Office in the corresponding Japanese Patent Application No. 2012-542745 and partial English translation thereof. (5 pages).
*International Search Report (PCT/ISA/210) issued on Feb. 15, 2011, by the Japanese Patent Office as the International Searching Authority for International Application No. PCT/JP2010/069925.
*Written Opinion (PCT/ISA/237) issued on Feb. 15, 2011, by the Japanese Patent Office as the International Searching Authority for International Application No. PCT/JP2010/069925.

(Continued)

*Primary Examiner* — Yuriy Semenenko
(74) *Attorney, Agent, or Firm* — Buchanan Ingersoll & Rooney PC

(57) ABSTRACT

A package includes a main unit having formed therein a through hole that penetrates the package from a first surface to a second surface; and a connection terminal that is provided inside the through hole. The second surface is a bottom surface of the main unit, and has an electric circuit incorporated therein. The connection terminal is electrically connected to the electric circuit incorporated in the main unit, and configured to be contactable by an insertion target that is inserted in the through hole from a side of an inserting direction.

8 Claims, 3 Drawing Sheets

(51) Int. Cl.
  *B81B 7/00* (2006.01)
  *H01L 23/31* (2006.01)
  *H01L 23/495* (2006.01)
  *H01R 13/11* (2006.01)
  *H01R 13/405* (2006.01)
  *H01L 23/00* (2006.01)

(52) U.S. Cl.
  CPC .... *H01R 13/405* (2013.01); *H05K 2201/10189* (2013.01)

(56) References Cited

FOREIGN PATENT DOCUMENTS

| JP | 6-79093 U | 11/1994 |
|---|---|---|
| JP | 2002-124602 A | 4/2002 |
| JP | 2002124602 * | 4/2002 |

OTHER PUBLICATIONS

Office Action (Notice of Preliminary Rejection) issued on Jul. 17, 2014, by the Korean Patent Office in corresponding Korean Patent Application No. 10-2013-7010318, and an English Translation of the Office Action. (7 pages).

Notice of Final Rejection issued on Dec. 16, 2014 by the Korean Patent Office in corresponding Korean Patent Application No. 10-2013-7010318, and an English Translation of the Office Action. (5 pages).

Notice of Preliminary Rejection issued on Feb. 9, 2015 by the Korean Patent Office in corresponding Korean Patent Application No. 10-2013-7010318, and an English Translation of the Office Action. (7 pages).

Notification of the First Office Action issued on Mar. 30, 2015 by the Chinese Patent Office in corresponding Chinese Patent Application No. 201080069800.9, and an English Translation of the Office Action. (9 pages).

* cited by examiner

PACKAGE

FIELD

The present invention relates to a package having incorporated therein an electric circuit such as a semiconductor device and a MEMS (Micro Electro Mechanical Systems).

BACKGROUND

A general package having an electric circuit incorporated therein is configured to include a main unit having an electric circuit such as a semiconductor device sealed therein and an electrode (such as a lead terminal, a solder ball, and a lead frame) that is connected to the electric circuit sealed in the main unit and projects from the main unit. Examples of such a package include a type of package that is mounted on a substrate by an electrode that projects from a side surface or a mounting surface of a main unit.

There is a case where a package mounted on a substrate is electrically connected to another substrate or an external device. For example, the package is connected to an external device via a connector or a cable that are mounted on a substrate separately from the package. In this case, a wiring pattern is formed on the substrate in order to connect the package to the connector or the cable. Therefore, it has been difficult to suppress an increase of a mounting area. Furthermore, in a high-frequency signal transmission, because of the presence of the wiring pattern, signal degradation due to electrical inconsistency occasionally occurs.

Conventionally, for example, as a technique for solving such a problem, Patent Literature 1 discloses a package of an integrated connector type in which a connector is formed with a main unit in an integrated manner and the package can be directly connected to an external device and the like.

CITATION LIST

Patent Literature

Patent Literature 1: Japanese Patent Application Laid-open No. 6-13480

SUMMARY

Technical Problem

However, in the integrated connector package, when a pressure is applied on a connector part from outside by a connection terminal such as a pin contact, the pressure tends to be applied also on the main unit. Therefore, there have been problems such as the main unit is broken by a stress applied on the main unit and fatigue breakage occurs due to the stress applied on a mounting part of a substrate, thereby causing a connection failure.

The present invention has been achieved in view of the above problems, and an object of the present invention is to provide a package that can decrease a stress load on a main unit caused by connection between the package and an external circuit, while suppressing an increase of a mounting area.

Solution to Problem

To solve the above described problems an achieve the object a package according to the present invention includes: a main unit having formed therein a through hole that penetrates the package from a first surface to a second surface, which is a bottom surface of the package, and having an electric circuit incorporated therein; and a connection terminal that is provided inside the through hole, electrically connected to the electric circuit incorporated in the main unit, and configured to be contactable to an insertion target that is inserted in the through hole from a side of an inserting direction.

Advantageous Effects of Invention

The package according to the present invention can decrease a stress load on a main unit caused by connection between the package and an external circuit, while suppressing an increase of a mounting area.

DESCRIPTION OF EMBODIMENTS

Exemplary embodiments of a package according to the present invention will be explained below in detail with reference to the accompanying drawings. The present invention is not limited to the embodiments.

First Embodiment.

Figure 1:
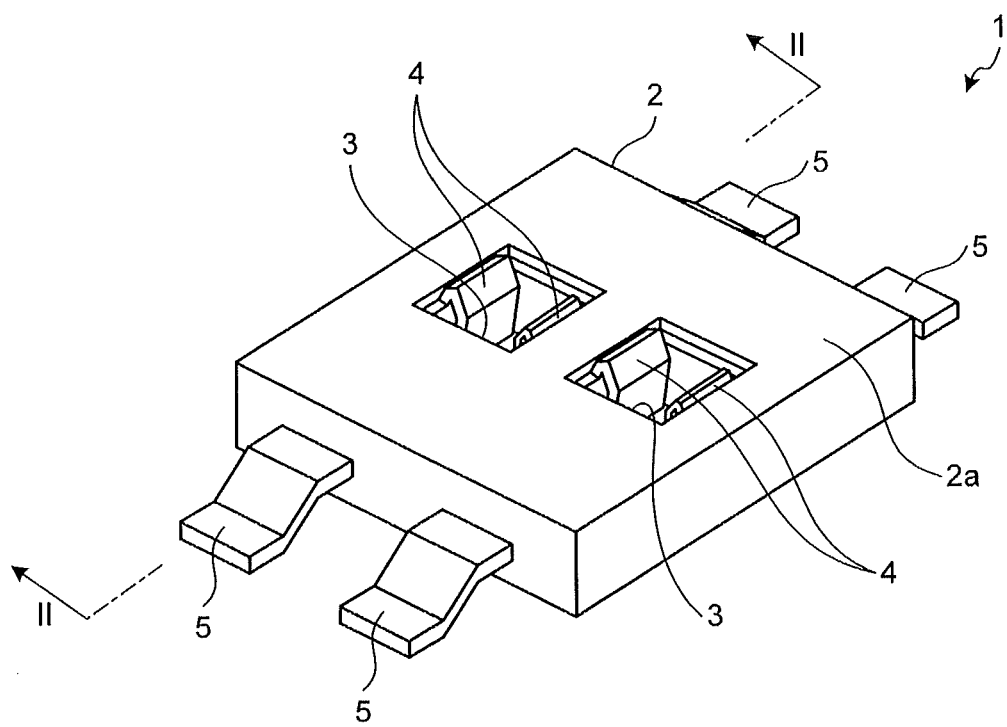
FIG. 1 is an external perspective view of a schematic configuration of a package according to a first embodiment of the present invention.
Figure 2:
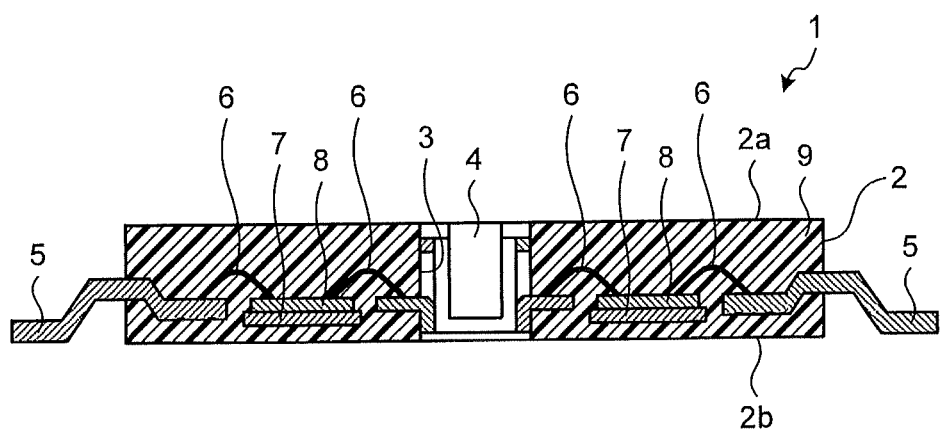
FIG. 2 is a cross-sectional view on arrow taken along a line II-II shown in FIG. 1.
Figure 3:
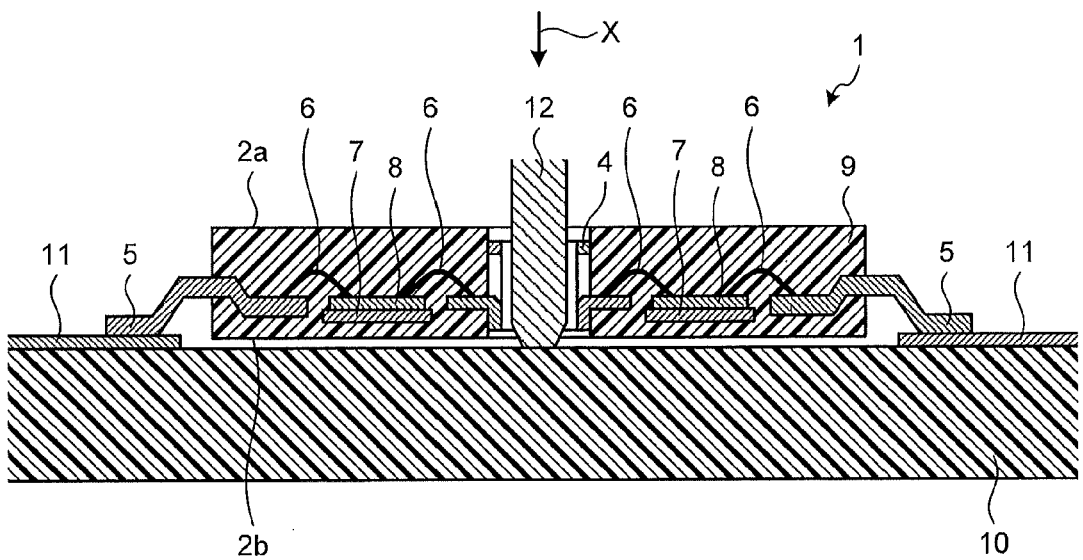
FIG. 3 is a cross-sectional view of a state where a pin contact is inserted in a through port of a package that is mounted on a substrate.

FIG. 1 is an external perspective view of a schematic configuration of a package according to a first embodiment of the present invention. FIG. 2 is a cross-sectional view on arrow taken along a line II-II shown in FIG. 1. FIG. 3 is a cross-sectional view of a state where a pin contact is inserted in a through port of a package that is mounted on a substrate. A package 1 having an electric circuit incorporated therein includes a main unit 2. The main unit 2 is configured to include a mold part 9 that is molded by resin.

Electrodes 5 that protrude from the inside of the main unit 2 are provided on sides of the main unit 2. Dies 8 attached on a lead frame 7 are provided in the main unit 2. In the main unit 2, each of the electrodes 5 is connected to an electric circuit formed on the dies 8 via a bonding wire 6.

As shown in FIG. 3, the package 1 is mounted on a substrate 10 by soldering the electrodes 5 to a wiring pattern 11 formed on a surface of the substrate 10. With this configuration, the electric circuit (the die 8) incorporated in the package 1 is electrically connected to the wiring pattern 11 formed on the substrate 10.

In the main unit 2, there is formed a through port (through hole) 3 that penetrates the main unit 2 from a top surface (first surface) 2a to a bottom surface 2b (second surface) thereof. A connection terminal 4 is provided inside of the through port 3. In the inside of the main unit 2, the connection terminal 4 is connected to the electric circuit formed on the dies 8 via the bonding wire 6.

The through port 3 may be provided in plural according to the size and arrangement of internal circuits of the main unit 2. While two through ports 3 are provided in the present embodiment, the number of the through port may be only one or three or more.

As shown in FIG. 3, a pin contact (insertion target) 12 is inserted in the through port 3. The connection terminal 4 is provided inside the through port 3, and is provided from a side of an inserting direction (the direction indicated by an arrow X) of the pin contact 12 so as to be contactable to the pin contact 12.

The connection terminal 4 is configured as an elastic member such as a leaf spring that applies a biasing force to the pin contact 12 from a side of the direction indicated by the arrow X, so as to more securely contact to the pin contact 12 inserted in the through port 3. The connection terminal 4 may be provided in plural to one through port 3. In the first embodiment, two connection terminals 4 are provided so as to face each other. With this configuration, the pin contact 12 inserted in the through port 3 is sandwiched by these connection terminals 4.

The pin contact 12 is also provided in a device other than the package 1 or in a substrate other than the substrate 10 having the package 1 mounted thereon so as to realize electric connection between the package 1 and the device or the substrate. Furthermore, as the pin contact 12 makes a contact to the connection terminal 4, the pin contact 12 and the electric circuit (the die 8) incorporated in the package 1 are electrically connected to each other via the connection terminal 4 and the bonding wire 6.

The connection terminal 4 is formed with a size capable of being accommodated inside the through port 3. The connection terminal 4 is provided so as to protrude from the through port 3 to the side of neither the top surface 2a nor the bottom surface 2b of the main unit 2.

As explained above, when the pin contact 12 is inserted in the penetrating port 3 formed in the main unit 2 in order to connect the package 1 to an external device via the pin contact 12 after the package 1 is mounted on the substrate 10, the pin contact 12 penetrates the through port 3, and therefore a stress is hardly applied directly on the main unit 2.

Therefore, it is possible to suppress: breakage of the package 1 itself due to a stress at the time of connection; and occurrence of a connection failure caused by fatigue breakage due to a stress applied on a mounting part of a substrate from the electrode 5. Furthermore, because the package 1 can be directly connected to an external device, forming of a pattern on the substrate 10 for connection between members and mounting of other connectors can be omitted. Therefore, it is possible to suppress an increase of a mounting area and to prevent signal degradation due to electrical inconsistency.

Furthermore, because the connection terminal 4 applies a biasing force to the pin contact 12 from a side of the direction indicated by the arrow X, the connection terminal 4 can make a contact to the pin contact 12 more securely and occurrence of a contact failure can be suppressed.

Further, the connection terminal 4 is provided so as to protrude from the through port 3 to the side of neither the top surface 2a nor the bottom surface 2b of the main unit 2. Therefore, by providing the connection terminal 4 inside the through port 3, it is possible to prevent the thickness of the entire package 1 from increasing.

In the first embodiment, the package 1 has been explained by exemplifying a surface mounting package of an SOP type; however, the first embodiment is not limited thereto. For example, the configuration explained in the first embodiment may be applied to a package of a QFP type or a BGA type, and the configuration explained in the first embodiment may be also applied to packages of other types.

Second Embodiment.

Figure 4:
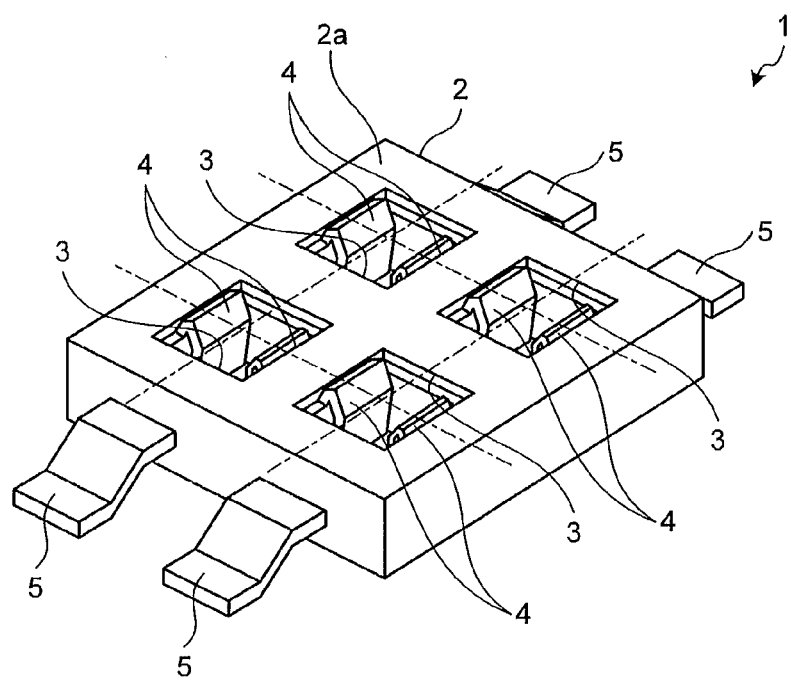
FIG. 4 is an external perspective view of a schematic configuration of a package according to a second embodiment of the present invention.
Figure 5:
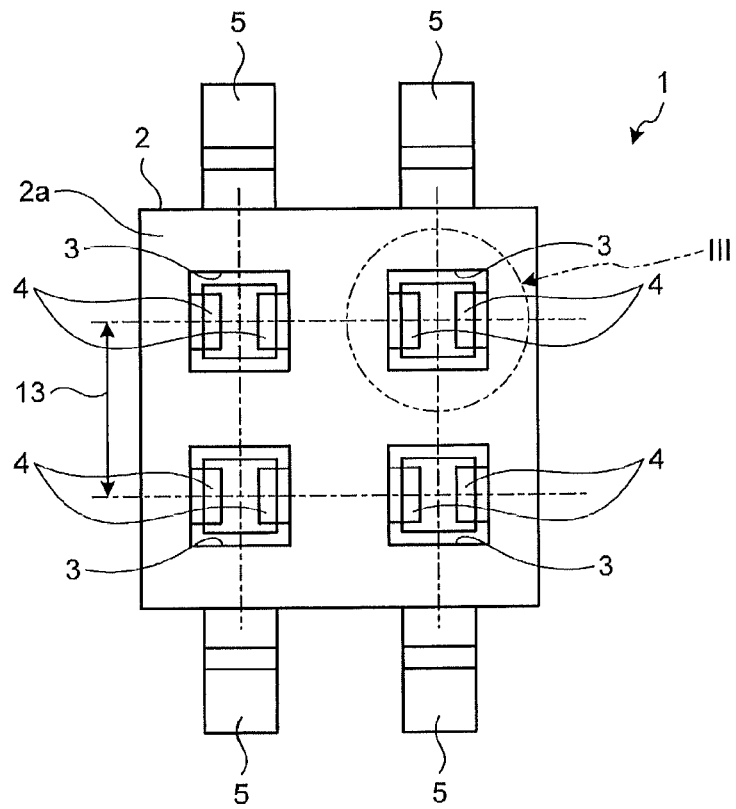
FIG. 5 is a top view of the package shown in FIG. 4.

FIG. 4 is an external perspective view of a schematic configuration of a package according to a second embodiment of the present invention. FIG. 5 is a top view of the package shown in FIG. 4. Constituent elements identical to those of the first embodiment described above are denoted by like reference signs and detailed explanations thereof will be omitted.

In the second embodiment, four through ports 3 are formed in the main unit 2, and these through ports 3 are arranged in a lattice form with an equal distance therebetween. These through ports 3 are arranged such that a distance between centers of these through ports, which is a port arrangement pitch 13, is of a size conformable to a predetermined standard, such as 2.54 millimeters or 1.27 millimeters.

In this manner, by setting the port arrangement pitch 13 to have a size conformable to a predetermined standard, it becomes possible that the package is directly connected to an external device such as a device including a general-purpose connector such as a pin header. The number of the through ports 3 can be appropriately changed according to the size and arrangement of internal circuits of the main unit 2.

Figure 6:
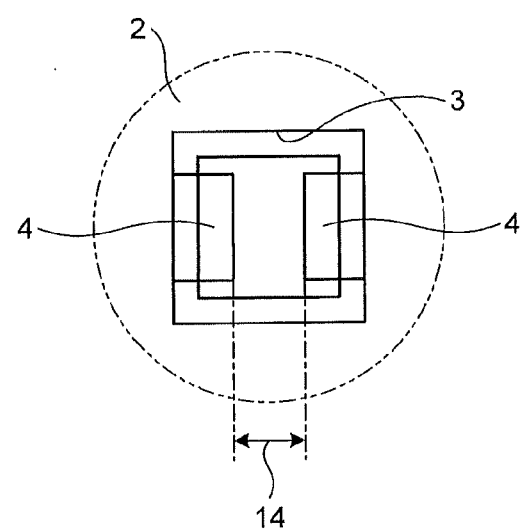
FIG. 6 is a partial enlarged diagram in which a part III shown in FIG. 5 is enlarged.

FIG. 6 is a partial enlarged diagram in which a part III shown in FIG. 5 is enlarged. In the second embodiment, similarly to the first embodiment, two connection terminals 4 are provided so as to face each other. Furthermore, a distance between these connection terminals 4, which is a distance 14 between terminals, is set to be smaller than a pin diameter (0.4 millimeter to 0.6 millimeter) of a generally used pin header.

With this configuration, as far as the pin contact 12 is a pin contact including a general pin header, a biasing force from the connection terminal 4 can be securely applied to the side of the pin contact 12, and the pin contact 12 and the connection terminal 4 can be electrically connected to each other more securely.

In the second embodiment, the package 1 has been explained by exemplifying a surface mounting package of an SOP type; however, the second embodiment is not limited thereto. For example, the configuration explained in the second embodiment can be applied to a package of a QFP type or a BGA type, and the configuration explained in the second embodiment can be also applied to packages of other types.

INDUSTRIAL APPLICABILITY

As described above, the package according to the present invention is useful as a package having an electric circuit incorporated therein, and is particularly suitable as a package configured to be directly connected to an external device and the like.

REFERENCE SIGNS LIST 1 package
2 main unit
2a top surface (first surface)
2b bottom surface (second surface)
3 through port (through hole)
4 connection terminal
5 electrode
6 bonding wire
7 lead frame
8 die
9 mold part
10 substrate 11 wiring pattern
12 pin contact (insertion target)
13 port arrangement pitch
14 distance between terminals
X arrow

The invention claimed is:

1. A package comprising:
a main unit having formed therein a through hole that penetrates the package from a first surface to a second surface, which is a bottom surface of the main unit, and having an electric circuit incorporated therein; and
a connection terminal that is provided inside the through hole, electrically connected to the electric circuit incorporated in the main unit, and configured to be contactable to an insertion target that is inserted in the through hole from a side of an inserting direction, wherein the connection terminal includes a hook portion that attaches to a rim in the through hole.

2. The package according to claim 1, wherein the connection terminal is an elastic member that applies a biasing force toward the insertion target from a side of an inserting direction.

3. The package according to claim 1, wherein the connection terminal is accommodated inside the through hole so as not to project to a side of either the first surface or the second surface of the main unit.

4. The package according to claim 1, wherein a plurality of the through holes are formed in the main unit, and the through holes are respectively arranged with a pitch of 2.54 millimeters or a pitch of 1.27 millimeters.

5. The package according to claim 1, wherein
at least a pair of connection terminals is provided so as to face each other inside of the through hole, and
a distance between the connection terminals facing each other is set to be equal to or larger than 0.4 millimeter and smaller than 0.6 millimeter.

6. The package according to claim 1, wherein the connection terminal contacts only one wall of the through hole.

7. The package according to claim 1, wherein the first surface of the main unit is a top surface of the main unit and the connection terminal reaches the top surface.

8. The package according to claim 1, wherein a pair of connection terminals is provided in the through hole so that the connection terminals face each other, and a distance between the connection terminals at an upper portion of the connection terminals is greater than a distance between the connection terminals at a lower portion of the connection terminals.

* * * * *